(12) United States Patent
Frambati et al.

(10) Patent No.: US 11,300,706 B2
(45) Date of Patent: Apr. 12, 2022

(54) DESIGNING A GEOLOGICAL SIMULATION GRID

(71) Applicant: Total S.A., Courbevoie (FR)

(72) Inventors: Stefano Frambati, Pau (FR); Alejandro Rodriguez Martinez, Navailles Angos (FR)

(73) Assignee: TOTAL SE, Courbevoie (FR)

(*) Notice: Subject to any disclaimer, the term of this patent is extended or adjusted under 35 U.S.C. 154(b) by 351 days.

(21) Appl. No.: 16/478,111

(22) PCT Filed: Jan. 19, 2017

(86) PCT No.: PCT/IB2017/000156
§ 371 (c)(1),
(2) Date: Jul. 15, 2019

(87) PCT Pub. No.: WO2018/134635
PCT Pub. Date: Jul. 26, 2018

(65) Prior Publication Data
US 2019/0361147 A1 Nov. 28, 2019

(51) Int. Cl.
*G01V 99/00* (2009.01)
*G06F 30/23* (2020.01)

(52) U.S. Cl.
CPC .......... *G01V 99/005* (2013.01); *G06F 30/23* (2020.01)

(58) Field of Classification Search
CPC ........ G01V 99/005; G01V 1/301; G01V 1/48; G01V 1/50; G01V 2210/64;
(Continued)

(56) References Cited

U.S. PATENT DOCUMENTS

| 2012/0022837 A1 | 1/2012 | Asbury et al. |
| 2013/0231903 A1 | 9/2013 | Li et al. |

(Continued)

FOREIGN PATENT DOCUMENTS

| WO | WO 2011/059535 A1 | 5/2011 |
| WO | WO 2015/187208 | 12/2015 |
| WO | WO 2018/134635 A1 | 7/2018 |

OTHER PUBLICATIONS

International Search Report for International App. No. PCT/IB2017/000156, dated Oct. 2, 2017, in 3 pages.
(Continued)

*Primary Examiner* — Jaehwan Oh
(74) *Attorney, Agent, or Firm* — Knobbe Martens Olson & Bear, LLP

(57) ABSTRACT

The invention notably relates to a computer-implemented method for designing a geological simulation grid, the method comprising: providing a geometrical grid that conforms to a set of geological structures of a geological environment; providing a geometrical surface that represents a geological surface of the geological environment, the geological surface being outside the set of geological structures; identifying geometrical structures of the geometrical grid that each correspond to a respective location of the geometrical surface; and transferring to each identified geometrical structure one or more respective parameters, each parameter being a value of a respective property of the geological surface. This improves the field of geological simulation.

13 Claims, 5 Drawing Sheets

(58) Field of Classification Search
CPC ....... G01V 2210/642; G01V 2210/646; G01V 2210/66; G01V 2210/74; E21B 41/0092; G06F 30/20; G06F 30/23
See application file for complete search history.

(56) References Cited

U.S. PATENT DOCUMENTS

| | | | |
|---|---|---|---|
| 2014/0136158 A1* | 5/2014 | Hegazy | G06T 17/05 703/2 |
| 2015/0355373 A1* | 12/2015 | Zhuo | G06F 17/10 703/2 |
| 2016/0103246 A1* | 4/2016 | Freeman | G01V 99/005 703/10 |
| 2016/0124117 A1* | 5/2016 | Huang | G06T 17/05 703/2 |
| 2018/0031719 A1 | 2/2018 | Huang et al. | |

OTHER PUBLICATIONS

Sieranoja, Sami. "High dimensional kNN-graph construction using space filling curves." Master's Thesis at University of Eastern Finland, Apr. 2015. 59 pages.

* cited by examiner

DESIGNING A GEOLOGICAL SIMULATION GRID

FIELD OF THE INVENTION

The invention relates to the field of geological simulation, and more particularly to a computer-implemented method, a computer program and a computer system for designing a geological simulation grid, for example a grid configured for reservoir simulation such as flow simulation.

BACKGROUND

Geological simulation refers to all techniques for performing computer simulations related to a geological environment. These techniques assist actors by providing them with computerized representations of real, estimated or predicted states and/or processes related to the geological environment. For example, in the context of hydrocarbon production (e.g. oil and/or gas production), flow simulation may provide useful information as to how hydrocarbons flow in a reservoir environment. Flow simulation may for example represent real, estimated or predicted flow paths, flow rates, flowing compositions, and/or evolutions of these quantities over time.

In many existing solutions, geological simulation is performed with finite element processing based on geological simulation grids. Geological simulation grids comprise a geometrical grid which conforms to shapes of geological structures, such as horizons, fault surfaces, channels and/or reservoirs. For example, horizons correspond to layer structures of the geometrical grid and fault surfaces correspond to stair-stepped structures of the geometrical grid. Geological simulation grids further comprise parameters which represent geological properties of the geological structures, such as flow parameters, and which are assigned to geometrical structures of the geometrical grid. A geological simulation grid may be inputted to a finite element simulator which performs geological simulations, such as flow simulation, according to the values of the geological properties conveyed by the parameters and to the shapes of the geometrical grid.

Because of the size of the geological environments and the numbers of geological structures at stake, designing a geological simulation grid is a tedious task. Designing a geometrical grid in particular is time-consuming. Geometrical grids may indeed comprise more than ten million of cells in some situations. For this reason notably, the result is most often inaccurate, in the sense that simulations performed on the basis of a designed geological simulation grid are most often inaccurate.

Document US 2016/0103246 A1 for example recognizes that there may be a spatial discrepancy between a stair-stepped grid structure and a surface representing a discontinuity in a geological environment, such as a fault surface. The document proposes mapping the stair-stepped grid structure and the surface. This way, properties associated with the stair-stepped grid structure may be adjusted based on the mapping to compensate for the spatial discrepancy.

However, although such improvements are provided, there is still a need for solutions to design in a relatively simple way geological simulation grids which are relatively accurate.

SUMMARY OF THE INVENTION

It is therefore provided a computer-implemented method for designing a geological simulation grid. The method comprises providing a geometrical grid that conforms to a set of geological structures of a geological environment. The method also comprises providing a geometrical surface that represents a geological surface of the geological environment. The geological surface is outside the set of geological structures. The method also comprises identifying geometrical structures of the geometrical grid that each correspond to a respective location of the geometrical surface. The method also comprises transferring to each identified geometrical structure one or more respective parameters. Each parameter is a value of a respective property of the geological surface.

Such a method improves the field of designing geological simulation grids, by allowing to design in a relatively simple way a geological simulation grid which is relatively accurate.

Notably, the method allows configuring a geological simulation grid with respect to a geological surface. For that, the method comprises identifying geometrical structures of the geometrical grid that correspond to the geological surface and accordingly transferring to the geometrical grid parameters that represent properties of the geological surface. Examples that allow addressing particularly efficiently the algorithmic complexity of the task of identifying the relevant geometrical structures are provided later.

As opposed to the solution disclosed by document US 2016/0103246 A1, the method provided herein does not necessitate that an existing structure of the geometrical grid conform to the geological surface. The method provided herein indeed processes a geological surface which is outside the set of geological structures. The method thus allows late-addition of information related to a geological surface to a geological simulation grid having an already-designed geometrical grid.

Such addition of information is performed in a relatively simple way, that is, by identifying relevant geometrical structures and transferring parameter data directly to such identified structures (instead for example of re-designing the geometrical grid to make sure that a structure of the geometrical grid conforms to the geological surface as well). The method thus offers a computationally cheap alternative to re-designing the geological simulation grid from scratch.

Furthermore, the method may perform whichever the geometry of the geological surface. The method may perform notably even if the geometrical structures of the geometrical grid corresponding to the geometrical surface do not form a stair-stepped grid structure. The method can thus be applied for any type of geological surface. Similarly, the method may perform whichever the geometry of the geometrical grid. The method may perform notably even if the geometrical grid is irregular or yet unstructured.

The method may comprise one or more of the following:
- the geometrical surface is provided based on data obtained after a determination of the geometrical grid;
- the geometrical grid is provided with an initial set of parameters each assigned to a respective geometrical structure of the geometrical grid, the identifying and the transferring being performed based on a result of a geological simulation performed with the geometrical grid and the initial set of parameters;
- the method includes comparing the result of the geological simulation performed with the geometrical grid and the initial set of parameters with corresponding real data;
- for at least one identified geometrical structure that corresponds to a respective location of the geological surface, at least one parameter of the transferred one or more respective parameters depends on a size of said respective location;

at least one property of the geological surface varies locally, each of the transferred one or more respective parameters that are a value of the at least one property being a local value;

the geometrical surface is composed of discrete elements, the identifying including determining cells of the geometrical grid that each intersect a respective discrete element;

the identifying further includes determining pairs of cells each including a respective first cell that intersects a respective discrete element and has a center located on one side of the geometrical surface and a respective second cell that is a neighbor of the respective first cell and has a center located on the other side of the geometrical surface;

at least one of the identified geometrical structures is an interface between a determined pair of cells;

the determining of cells of the geometrical grid that each intersect a respective discrete element is iterated over the discrete elements via one or more neighborhood propagations over the discrete elements of the geometrical surface;

at each non-starting iteration of each neighborhood propagation over the discrete elements of the geometrical surface, the determining (S310) of cells of the geometrical grid that each intersect a respective discrete element includes using cells determined at the previous iteration;

at each non-starting iteration of each neighborhood propagation over the discrete elements of the geometrical surface, the determining of cells of the geometrical grid that each intersect a respective discrete element is performed via a neighborhood propagation on the cells of the grid; and/or at each determining of a cell of the geometrical grid that intersects a respective discrete element, the method comprises transferring to the determined cell one or more respective parameters.

In examples, the method may comprise, with the same provided geometrical grid, providing a plurality of geometrical surfaces. The plurality of geometrical surfaces may represent, as a whole, one or more geological surfaces. The method may then perform for each geometrical surface the identifying of geometrical structures of the geometrical grid that each correspond to a respective location of the geometrical surface, and then transferring to each identified geometrical structure of one or more respective parameters.

In examples, the identifying and the transferring may be performed after initially constructing a space search structure. The construction may be performed only once, such that the same initial space search structures may be used for all the geometrical surfaces.

In examples, the plurality of geometrical surfaces may comprise more than 1000 or 500 or 50.

It is further provided a simulation process which comprises performing a geological simulation based on the designed geological simulation grid, for example according to any finite element simulation technique. The simulation process may comprise performing the method for designing the geological simulation grid before performing the geological simulation, for example with the same system as the one that performs the geological simulation, or alternatively providing the already-designed geological simulation grid, for example by receiving the already-designed geological simulation grid from a distant system. The simulation process may be a hydrocarbon flow simulation process.

It is further provided a computer program comprising instructions for performing the method and/or the simulation process.

It is further provided a data structure representing a geological simulation grid obtainable by the method.

It is further provided a data storage medium having recorded thereon the computer program and/or the data structure.

It is further provided a system comprising a processor coupled to a memory, the memory having recorded thereon the computer program and/or the data structure. The system may further comprise a display configured for displaying outputs of the computer program and/or a graphical user interface for entering inputs of the computer program.

It is further provided a hydrocarbon production process which comprises performing one or more simulation phases according to the (e.g. flow) simulation process and one or more production phases. The simulation phases and the production phases may be interlaced. In other words, the production process may comprise alternations between simulation phases and production phases. The alternations may comprise overlaps. One or more of the production phases may be based on a result of one or more of the simulation phases, for example a result of the last simulation phase. A production phase may be based on a result of a simulation phase for example by setting a production parameter as a function of said result.

The geological simulation grid used at different simulation phases may be different. Notably, the geological simulation grid used at a simulation phase may be obtained by performing the method for designing a geological simulation grid starting from the geological simulation grid of a previous simulation phase and adding information related to a given geological surface, optionally after having deleted other information. The given geological surface may be outside the set of geological structures to which the geometrical grid of the geological simulation grid of said previous simulation phase was initially designed to conform.

For example, the production process may comprise acquiring information on the geological surface (e.g. by detecting the given geological surface from measurements on the geological environment, for instance seismic data) and/or detecting inconsistency between data measured during a production phase and a result of a preceding simulation phase. In such cases, the production process may comprise performing the method to refine the geological simulation grid with information related to the given geological surface. The production process may then comprise a new simulation phase based on the refined geological simulation grid and/or then a new production phase based on the new simulation phase.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

Figure 1:
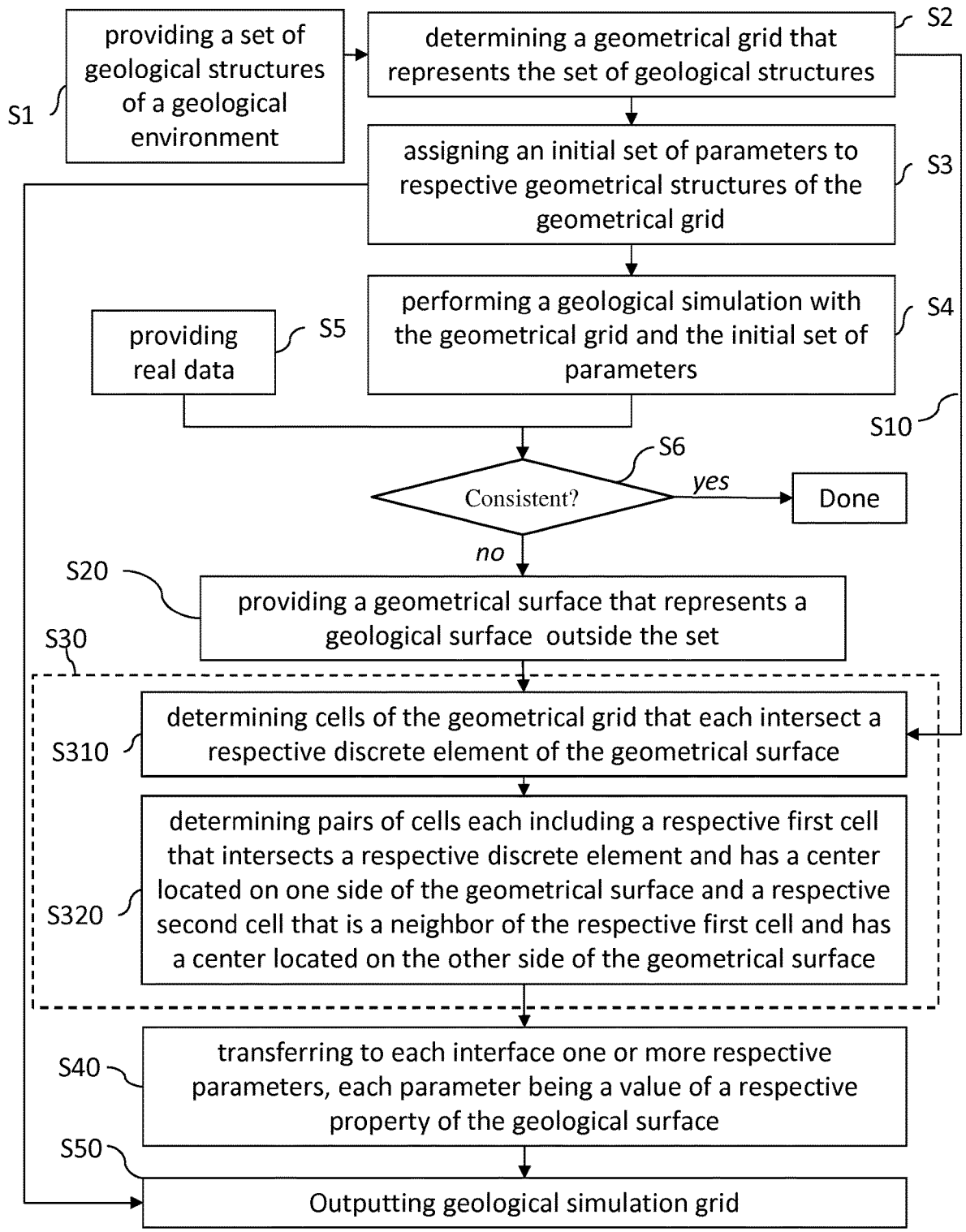
FIG. 1 shows a flowchart of an example of the method.

The expression "designing a geological simulation grid" designates any operation participating to the design of a geological simulation grid, not limited to designs performed from scratch. In examples, as mentioned earlier, the method may start from an existing geological simulation grid and simply refine said existing geological simulation grid, the refinement being referred to by the expression "designing a geological simulation grid".

The geological environment may be any geological environment of interest, for example any subsoil, for example a subsoil comprising, consisting or forming a part of one or more hydrocarbon fields, such as oil and/or gas field(s).

The geological environment comprises geological structures. A geological structure is a formation in the geological environment that is of interest to any geological phenomenon that may occur in the geological environment. A geological structure may be a reservoir, a horizon, an unconformity, an intrusion, a channel, a salt diapirism, a fold, a fault or yet a zone of steam presence or a front surface thereof in a steam-assisted gravity drainage (SAGD) situation.

A geological simulation grid is any data structure that comprises a geometrical grid, that optionally also comprises parameters assigned to geometrical structures of the geometrical grid and that represent geological properties, and that is configured for one or more geological simulations contemplated to be performed with respect to the geological environment. For this purpose, the geometrical grid and its possibly assigned parameters may be inputted to finite element simulators, which may perform geological simulations in any known way. The one or more geological simulations may each be of any type. A geological simulation is a representation of one or more real, estimated or predicted states and/or processes related to the geological environment. The geological simulation may for example comprise one or more estimations of reserves and/or one or more flow simulations, also referred to as "reservoir simulations".

The geometrical grid is a data structure that represents a spatial distribution of geometrical cells. The geometrical grid and/or the geometrical cells may be of any dimension, for example three-dimensional. Each geometrical cell represents a respective real cell of the geological environment. All or a part of the geometrical cells of the geometrical grid may be of a cuboid or an at least substantially cuboid shape. One or more of the dimensions of all or a part of the geometrical cells may be superior to 1 meter, 2 meters, or 5 meters and/or inferior to 1000 meters, 500 meters, or 200 meters. The geometrical cells may for example be of a cuboid shape, and/or of dimensions of the order of 80 meters×80 meters×10 meters (e.g. ±50%, 25% or 10% for each dimension). The geometrical grid may comprise more than 10 000, 100 000 or yet 1 000 000 geometrical cells. The geometrical grid may comprise less than 100 000 000 or 50 000 000 cells. The number of cells may be of the order of 10 000 000 (e.g. ±50%, 25% or 10%). All, substantially all, or at least a majority of the cuboid cells may be positioned horizontally or at least substantially horizontally. The geometrical grid may be regular or irregular, and/or structured or unstructured.

The geometrical grid conforms to a set of geological structures of the geological environment (the set being for example any set comprising geological structures of interest to the contemplated one or more geological simulations, that is, geological structures corresponding to the one or more geological simulations). This means as known per se that the gridding is constrained by the set of geological structures, such that for each given geological structure of the set, a corresponding geometrical structure of the geometrical grid conforms to the given geological structure. Optionally, such geometrical structures may be marked accordingly, that is to convey such correspondence information.

A geometrical structure of the geometrical grid is any one or any combination of one or more cells, one or more faces, one or more edges, and/or one or more vertices. A geometrical structure conforms to a given geological structure when the geometrical structure matches at least substantially the given geological structure. A given geometrical structure matches at least substantially a given geological structure when the spatial discrepancy between the given geometrical structure and the given geological structure is inferior or equal to a predetermined threshold.

The spatial discrepancy may for example be measured as the Hausdorff distance between surfaces representing respectively the given geometrical structure and the given geological structure. The spatial discrepancy may alternatively be measured as the sum over all grid cells intersected by the surface representing the given geological structure of the absolute cell volumes displaced across the surface representing the given geological structure by position discrepancy with respect to the given geometrical structure.

As known per se, such a geometrical grid may be obtained based on the set of geological structures (e.g. excluding the use of any other geological structure data). For example, the method may comprise a prior stage of building a structural model of the set of geological structures, and then gridding the structural model. Alternatively the result of such a prior stage may be provided as such, for example retrieved from a memory or received from a distant system.

The geological surface provided in the method is outside (i.e. not included in) the set of geological structures to which the geometrical grid conforms. In other words, the geological surface is not based upon when obtaining the geometrical grid, for example it is not used in the building of the structural model (in other words, the geometrical grid is the result of gridding a structural model of a set of geological structures from which the geological surface is excluded).

In examples, the geological surface is unaligned with the set of geological structures. This means that the spatial discrepancy between the geological surface and any geological structure of the set is strictly superior to the above-mentioned predetermined threshold. In examples, the gridding does not conform to the geological surface, at least for a part of the geological surface.

The geological surface may be provided with positioning information relative to the geometrical grid. For example, the geological surface and the geometrical grid may be provided positioned in a same referential frame. This allows the identifying of geometrical structures of the geometrical grid that correspond to respective locations of the geological surface. The geological surface and the geometrical grid are defined in a same space, such that the geometrical surface intersects the geometrical grid at different locations of the geological surface. The geometrical structures of the geometrical grid that correspond to respective locations of the geological surface are geometrical structures that represent such local intersections between the geological surface and the geometrical grid.

Such geometrical structures may be identified within a predetermined set of geometrical structures of the geometrical grid, for example as those in the predetermined set that are the closest to match the geometrical surface. The predetermined set may depend on the nature of the geological surface and/or the nature of the respective parameters to be transferred. The predetermined set may be the set of all cells, the set of all cell pairs, or yet the set of all interfaces between pairs of cells. An interface between a pair of cells may be, for a pair of neighboring cells, the pair of faces between the two cells or the shared part common to the two faces of said pair, or the shared face if the two cells are aligned.

The geometrical surface may be composed of discrete elements, each corresponding to a respective location of the geometrical surface. The geometrical surface may for example be provided as a mesh, for example as a triangular mesh (i.e. each discrete element being a triangle). The number of discrete elements may be superior to 5 000, 1 000 000, or 10 000 000 and/or inferior to 20 000, 50 000 000, or 200 000 000, for example between 1 000 000 and 10 000 000 for a complex fault surface or a geological body surface, between 5 000 and 20 000 for a simple fault surface, between 10 000 000 and 50 000 000 for a local horizon surface, and between 50 000 000 and 10 000 000 for a regional horizon surface.

The identifying may be performed without any pre-knowledge of geometrical structures of the predetermined set corresponding to the geometrical surface.

For example, the geometrical surface may be provided based on data obtained after a determination of the geometrical grid. The method may for example be encompassed in a global process comprising: obtaining data relative to the set of geological structures of a geological environment to which the geometrical grid is to conform, then determining the geometrical grid to conform to said set of geological structures (e.g. via structural modeling and gridding as mentioned above), and then only obtaining data relative to the geometrical surface. Said data relative to the geometrical surface may be obtained via new measurements on the geological environment, new interpretations and/or new calculations based on previous measurements, and/or new reception from a third party and/or a distant system. The measurements may comprise seismic data measurements. The method allows in such cases to configure a previously-built geometrical grid with information relative to a geological surface which was unknown at the time of building the geometrical grid.

Alternatively, the data may be already present but discarded at the time of determining the geometrical grid in the global process. For example, an initial number of geological structures including the geological surface may be provided before determining the geometrical grid, e.g. consisting of all known geological structures of the geological environment. The global process may then comprise forming a set of said geological structures excluding the geological surface. For example, the global process may comprise selecting geological structures (excluding at least the geological surface), for example less than 75%, 50% or yet 25% of the initial number of known geological structures, for example consisting of most promising geological structures for the simulations to be accurate. The global process may then determine the geometrical grid to conform to said selected geological structures. The excluded geological surface may then be used any time later, e.g. based on any assessment that such use should be made. This allows an incremental design of the geological simulation grid, rather than a design taking all information into account from the beginning. This allows a faster determination of the geometrical grid, as it is based on relatively less data. This also allows reaching a geometrical grid which has relatively fewer cells, as fewer constraints are imposed. Such a geometrical grid may then be processed faster and/or lead to more accurate results during simulations.

The geometrical surface represents a geological surface of the geological environment, that is a surface geological structure of the geological environment. The geological surface may for example be a fault surface, a horizon surface, a geological body surface—such as a reservoir property boundary surface, a salt diapirism surface, or a channel surface-, or a front surface of a steam presence zone. The geometrical surface and the geological surface may be of a dimension superior to 100, 1 000 or 10 000 $m^2$ and/or inferior to 10 000 000 or 100 000 000 $m^2$, for example of the order of 1 000 000 $m^2$ (e.g. ±50%, 25% or 10%).

The geometrical grid may be provided with an initial set of parameters each assigned to a respective geometrical structure of the geometrical grid. The initial set of parameters may represent geological properties of the set of geological structures to which the geometrical grid conforms, and/or more generally any local property of the geological environment. Each parameter is a value of a respective property of a respective geological structure. For example, porosity, permeability, density and/or facies, net-to-gross values may be assigned to cells. Transmissivity or transmissibility values may be assigned to cell pairs and/or to interfaces between pairs of cells. Such parameters are configured to be processed by finite element simulators when performing geological simulations.

The method comprises transferring, to each geometrical structure identified as corresponding to a respective location of the geometrical surface, one or more respective parameters. Each transferred parameter is a value of a respective property of the geological surface. The method thus late-configures a geological simulation grid with respect to such geological properties of a geological surface. By "transferring" a parameter to a geometrical structure, it is simply meant that the method assigns said parameter to said geometrical structure.

The parameter assignments mentioned above may be coded in any way. Furthermore, conflicts between parameters assigned to a same geometrical structure or to overlaps between different geometrical structures may be handled in any way. The method may for example merge two parameters into one when performing an assignment. Alternatively the method may assign the two parameters as separate data, leaving it to simulators to later merge said parameters. This is a mere detail of implementation.

Examples of the method that allow a differentiated and refined transfer of parameters are now discussed.

In examples, a parameter transferred to an identified geometrical structure may depend on a size of the respective location of the geological surface which corresponds to said identified geometrical structure. This allows taking into account the extent to which the geological surface corresponds to the geometrical structure. For example, a fault surface may have a transmissivity property. A fault surface may for example be associated with a low transmissivity value, constituting a barrier to hydrocarbon flow across the surface. The method may model this by transferring a low parameter value representing such transmissivity, for example to all interfaces between pairs of cells of the geometrical grid that correspond to the fault surface. In examples, the parameter value transferred to a given interface may be a (e.g. proportionally) decreasing function of the area size of the fault surface identified by the method as corresponding to said given interface.

Alternatively or additionally, at least one property of the geological surface may vary locally (i.e. the value of the property is not constant over the surface but varies geographically). In such a case, if such local variation is known and such knowledge is provided together with the geometrical surface, each of the transferred parameters corresponding to said property may be a local value, thereby following the variation of the property itself. This allows taking into account the local character of the property. For example, a fault surface may have a varying downthrow. A parameter which represents the transmissivity may thereby vary accordingly when transferred to interfaces of the geometrical grid that correspond to the fault surface.

FIG. 1 shows a flowchart of an example of the method where the geometrical grid is provided with an initial set of parameters each assigned to a respective geometrical structure of the geometrical grid, and the identifying and the transferring are performed based on a result of a geological simulation performed with the geometrical grid and the initial set of parameters. This example allows refining the geological simulation grid by adding information relating to a new geological surface, depending on how (e.g. how well) the geological simulation grid before refinement performed in the geological simulation. This example of the method thereby offers a workflow which allows incrementally refining the geological simulation grid.

The method of the example comprises providing S1 a set of geological structures of a geological environment. The providing S1 is performed for example by a geologist. The method of the example then comprises determining S2 a geometrical grid that represents the set of geological structures provided at S1. The determining S2 may be performed in any known way by a geomodelling software, for example via a structural building and a gridding, as mentioned earlier. The method may optionally further include assigning S3 an initial set of parameters to respective geometrical structures of the geometrical grid. The assignment S3 may be performed after S2 or interlaced with S2, and the parameters assigned at S3 may be values of properties of the set of geological structures provided at S1. This may all be performed according to classical techniques.

At this point, the method of the example is provided with an initial geological simulation grid that represents a given set of geological structures. The method may thus optionally perform S4 a geological simulation with this initial geological simulation grid. The simulation may be any type of simulation, for example flow simulation. Before, in parallel to, or after S4, the method may optionally provide S5 real data. The real data may be any type of data relating to the geological environment, for example hydrocarbon production data and/or measurement data. The real data provided at S5 may be currently produced data or historical data retrieved from a database.

The method of the example then includes comparing S6 the result of the geological simulation performed at S4 with corresponding real data provided at S5. The comparison S6 amounts to verifying, in any way, consistency between simulation output and the real data. For example, flow simulation data outputted at S4 are compared with time-evolution of produced amounts of hydrocarbons provided by S5 to check for consistency. In case comparison S6 concludes to consistency, then the method may be ended.

In the opposite case, a user or an algorithm provides S20 a geometrical surface that represents a geological surface outside the set provided at S1. The geometrical surface may come from any source, as mentioned earlier. The aim is to refine the geological simulation grid, for example to later re-run S4-S5-S6, and so on.

In the example, the geometrical surface is composed of discrete elements. The identifying S30 of the example comprises determining S310 cells of the geometrical grid, each determined cell intersecting a respective discrete element of the geometrical surface. The geometrical grid determined at S2 is thus re-used here.

The identifying S30 of the example further comprises determining S320 among all cells outputted by S310 specific pairs of cells. Each pair of cells determined at S320 is, by construction, made of one cell that intersects a respective discrete element and has a center located on one side of the geometrical surface, and another cell which is a neighbor of the first cell and has a center located on the other side of the geometrical surface. Such identifying S30 allows identifying pairs of cells that correspond to the surface, and thereby interfaces between each cells of a pair. The surface is thus represented by a general structure of interfaces obtained by discrete computations.

The method of the example may thereby comprise transferring S40 to each interface parameters, and outputting S50 the refined geological simulation grid, that is a grid conveying the initial parameters assigned at S3 and the parameters newly-assigned at S40. Alternatively the transferring S40 may be performed on pairs of cells determined at S320 directly.

An implementation of the method in line with the example of FIG. 1 and which performs particularly efficiently from a computational point of view is now discussed.

In the implementation, the data structure that forms the geometrical grid and represents the spatial distribution of geometrical cells may comprise topological data that allow retrieving for each geometrical cell its neighboring geometrical cells in $O(1)$. Additionally or alternatively, the data structure that forms the geometrical surface composed of discrete elements may comprise topological data that allow retrieving for each discrete element (e.g. triangle) its neighboring discrete elements in $O(1)$.

Such topological data allow exploiting neighborhood information to perform the identifying S30 particularly fast via neighborhood propagations. A neighborhood propagation is an algorithmic looping over discrete elements of a geometrical entity (e.g. grid cells or surface elements e.g. triangles) which iterates neighbor-by-neighbor. In mathematical terms, a neighborhood propagation is an iteration that follows a space-filling curve. The geometrical grid and/or the geometrical surface may be filled each with one or more space-filling curves corresponding each to a respective neighborhood propagation.

Furthermore, in the implementation, at each determining S310, the method may comprise transferring to the determined cell one or more respective parameters. In other words, the identifying S30 and the transferring S40 are interlaced (although represented sequentially for the sake of clarity on FIG. 1), such that the neighborhood propagations are performed once only.

In specific, the determining S310 may be iterated over the discrete elements of the geometrical surface via one or more neighborhood propagations. In other words, in the example implementation the method determines cells of the geometrical grid that intersect the surface e.g. triangle-by-triangle, with sequences of neighboring triangles. Each sequence corresponds to a neighborhood propagation. There may be more than a sequence, as at some point a processed triangle may have no neighbor which has not been processed previously, in which case the global process "jumps" to a non-neighbor triangle to continue until all triangles are visited. Each neighborhood propagation allows to re-use data previously determined, as results between neighboring triangles are similar, due to the local nature of the problem to be solved.

In particular, at each non-starting iteration of each neighborhood propagation over the discrete elements of the geometrical surface, the determining S310 may include using cells determined at the previous iteration. Examples of such use are provided later.

Furthermore, at each non-starting iteration of each neighborhood propagation over the discrete elements of the geometrical surface, the determining S310 may be performed via neighborhood propagation on the cells of the grid. This further accelerates the identifying S30.

Thanks to such neighborhood propagations, the implementation allows the late-addition of information related to a geometrical surface not used when building the geometrical grid in an acceptable time, even though the number of cells and/or the number of discrete elements is particularly high. For example, with a geometrical grid having a number of cells of the order 100 000 000 and a complex fault surface, an example of the method was tested to run in about two or three hours.

An example of such implementation of the method is now detailed. The example of implementation of the method comprises the following steps:
- a) Determination of a first element of the surface that intercepts a cell of the geometrical grid ("seeder process"). The couple made of the surface element and one or more cells intercepting said element is called "seed". Optionally, this step may be performed using appropriate space search structures, such as to reduce the cost on all subsequent surfaces to process. This option is particularly advantageous when the number of surfaces to process is high. Indeed, the construction of space search structures may be a particularly time-consuming stage. But such construction may be performed once and for all for the grid, such that it can be re-used, thereby allowing global time saving.
- b) From this "seed" found at step a), determination of all cells near the initial cell intercepting said first element of the surface (such a cell group is called "bubble"). Surface properties are transferred from the surface element to the cells in the "bubble".
- c) Determination of all surface elements neighboring the first element. For each of these elements, a "seed" is created by associating the element and the "bubble".
- d) For each "seed" determined at step c), determination of all the cells near the the "bubble" group intercepting the surface element included in the "seed". These cells form a new "bubble". Surface properties are transferred from the surface element to the cells in the "bubble".
- e) Alternate repetition of steps c) and d) until identification of all the cells intercepting the surface. If the search ends before the surface is totally processed, then the method re-starts at step a) with a non processed surface element.
- f) For each cell determined as an output of step e), neighbors of the cell are considered, and all couples of neighboring cells located on opposite sides of the surface are retained.
- g) The surface is represented in the simulation grid by a list of connected cell couples, and it may be visualized by displaying the area common to two cells of the couples determined at the preceding step.
- h) The properties are transferred from cells to connections (i.e. interfaces) between cells based on the values at the cells of each couple.

The example of implementation of the method performs fast on geometrical grids which are structured or unstructured (e.g. with complexities as low as $O(n \log n)$ for the "seeding" part and $O(k)$ for the rest, as more detailed later), and it allows implicit introduction of surfaces in an existing grid without any modification of the grid which can cause precision loss and performance loss of the flow simulator.

The example of implementation of the method further allows contemplating a new workflow for constructing a reservoir grid, where only main faults are modeled in a first stage, secondary fault being possibly incorporated later in the reservoir grid in order to assess their crucial impact on the flow simulation. Such a workflow allows limiting the number of constraints in the construction phase of simulator grids, thereby allowing obtaining grids of a higher quality while preserving essential elements for a good representability of the simulation.

The example of implementation of the method also allows introduction of surface properties in the flow simulation, and more specifically at cell connections. For example, transmissivities depending on the fault downthrow or on the shale gouge ratio that vary locally on the surface can be introduced thanks to such method.

An example of application is the use of the method to introduce a certain number of structural faults (modeled as triangulated surfaces) in a pre-existing flow simulation model. The faults having a very variable downthrow on their surface, one may want to translate this property by variable transmissivity multipliers in the reservoir grid. Each connection intercepted by the fault may be assigned with a different transmissivity, which may be an empirical function of the local downthrow.

Pseudo-code that allows running the above-discussed example of implementation of the method is now provided.

The pseudo-code consists of six methods:

Method 1: main: Method for finding the list of connections intersected by a family of surfaces, while transferring the surface properties to the connections Input:
    A simulation grid: the grid is composed of a set of cells. For a given cell, the boundary and its list of neighbors must be known. The outside of the grid is treated as a special cell, whose boundary is composed by the outside faces of all the boundary cells in the grid;
    A list of surfaces with properties;

Prerequisite:
    Build a space search structure (e.g. search tree) on grid cells, called pointLocator, capable of locating points inside the grid;
    Build a space search structure (e.g. search tree) on the external faces of the grid, called externalSurfaceIntersector capable of quickly finding intersections of a surface element with the grid boundary. Unconforming faces are treated as external faces;

These structures are computed once and for all, and used by multiple steps of the method. Both trees can be built in $O(n \log n)$ time and queried in $O(\log n)$ time, where n is the number of cells in the grid, by using common data structures found in the literature.

Result: A list of connections between grid cells, with properties defined on them

---

```
Initialize an empty list of connections;
forall surface s do
    Find the cells that are intersected by the surface
    by      calling      intersectedCells    =
    intersectSurface(grid, s);
    Compute the intersected connections by calling
```

```
        findConnections(s, intersectedCells) and add them
        to the global list;
    end
return the list of connections
```

Method 2: intersectSurface: Method for intersecting a surface with the grid, and transferring its properties on intersected cells Input:

A simulation grid and a surface with properties;

Result: A set of cells intersecting the surface, with properties

```
Initialize an empty list of intersecting cells;
Select a face f of the surface, and call nextSeed(f)
to find a grid cell c (possibly external) touching
face f. The couple (f, c) will be the initial seed of
the search;
1 while there is a seed do
    Put the face f and its seed seed(f) in a queue q;
    while q is not empty do
        (f, seed(f)) ← q.pop( );
        bubble(f) ← propagateFace(f, seed(f));
        for all neighbors n of face f do
            if n has not already been visited then
                put n in the queue, using bubble(f) as
                a seed:
                q.push(n, bubble(f));
            end
        end
        Mark f as visited;
    end
    if there are any untreated faces left then
        Go to the next untreated face f and find the
        next seed by calling
        nextSeed(f);
        Go to 1;
    else
        The surface has been exhausted:
        return the list of cells
    end
end
```

Method 3: propagateFace: Method for finding all cells intersecting a face, starting from a seed Input: A face f and a seed seed(f)

Result: The bubble bubble(f), that is, the list of all grid cells touching f. This list is always nonempty, but it can contain the external cell

```
Initialize an empty bubble;
Initialize a queue q containing the seed cells;
while q is not empty do
    c ← q.pop( );
    if f intersects the boundary of c then
        Add c to the bubble;
        Call accumulateProperties(c, f) in order to
        transfer surface properties to the cell;
        Insert the neighbor(s) of c through the pierced
        face(s) into q;
    end
end
if the bubble is empty then
    The face f is completely contained in one of the
    cells, or completely outside the grid;
    Use pointLocator to know in which (possibly
    external) cell c the face f is contained, and add
    it to the bubble;
```

```
    If the cell c is not the external cell, call
    accumulateProperties(c, f)
end
return the bubble;
```

Method 4: nextSeed: Method for finding a face touching a cell of the grid

```
Input: A face f
Result: A cell c that touches f
Use the externalSurfaceIntersector to check if the
face f intersects one of the external faces of the
gird;
if f intersects then
    return the cell c adjacent to the intersected
    external face;
else
    The face f is either completely inside or
    completely outside the gird.
    Use the pointLocator to find the (possibly
    external) cell c in which it falls;
    return c;
end
```

Method 5: accumulateProperties: Method for accumulating properties in a grid cell

```
Input: A face f, carrying properties either on its vertices or on the face
itself, and a cell c intersecting the face
Result: Nothing: the property on cell c is set to reflect the surface property
Find the area A of the face which falls inside cell c;
forall properties on face f do
    Find the value v that the face transfers to the
    cell. If the property is defined on vertices, the
    value will be an appropriate average on the
    intersection polygon. If the value is defined on
    faces, then v will simply be the value on face f;
    For intensive properties, add A•v to the
    accumulated value acc in the cell. For extensive
    properties, add A•v/A_f, where A_f is the total area
    of face f;
end
Add A to the total weight w of the cell. The final
property value in c will be acc/w for intensive
properties, and just acc for extensive ones, after
accumulating all the faces in the surface;
```

Method 6: findConnections: Method for finding the connections between cells which are intersected by a surface, and transferring properties on them Input: A surface f and a list of grid cells intersected by f;

Result: A list of connections between grid cells, with properties defined on them

```
Initialize an empty list of connections;
forall intersected cells c do
    forall neighbors n of cell c do
        Find the sides of face f on which c and n lie;
        if c and n lie on opposite sides of f then
            Add the connection between c and n to the
            list of connections;
            if only one of the two cells has properties
            then
                Transfer the property to the
                connection;
            else
                Appropriately average the properties
                of both cells and add them to the
                connection;
            end
```

```
        end
      end
    end
    return the list of cells
```

FIGS. 2-5 illustrate the above pseudo-code.

Figure 2:
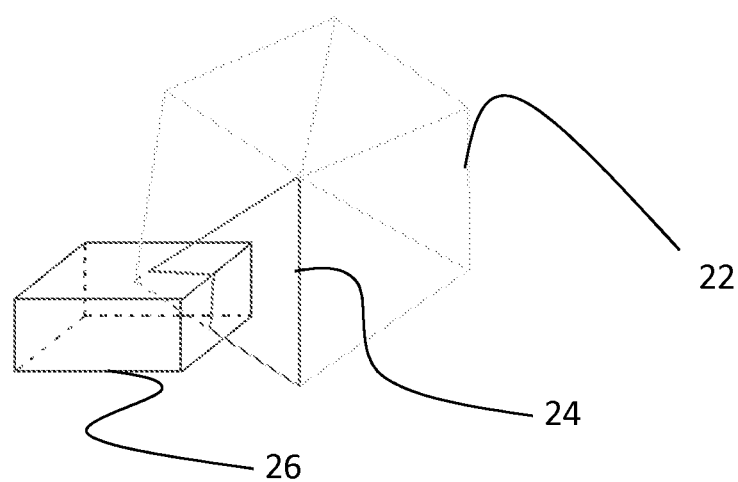
FIGS. 2-5 illustrate an example implementation of the method.
Figure 3:
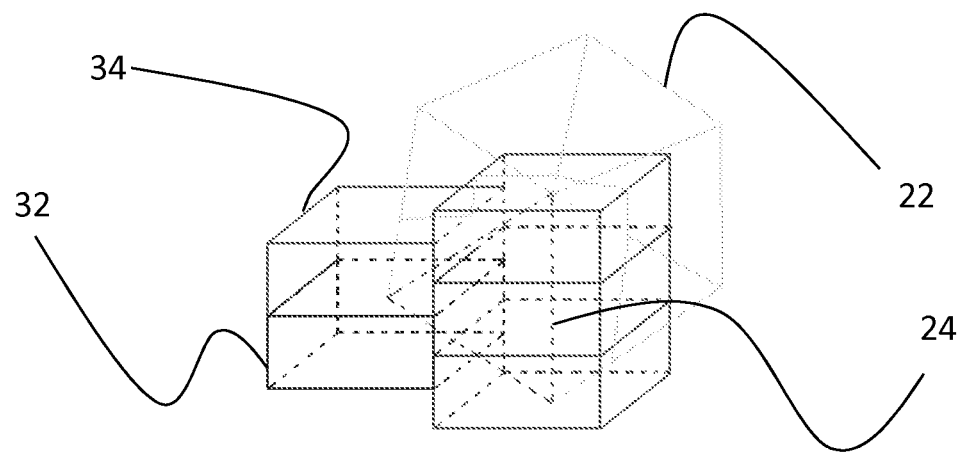
Figure 4:
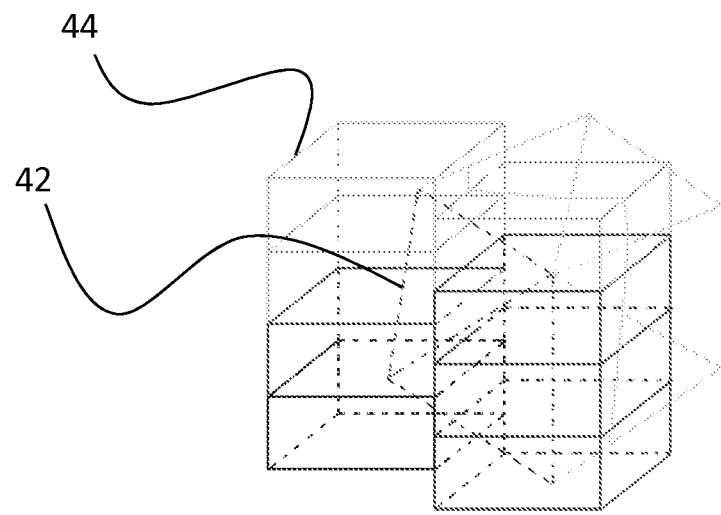
Figure 5:
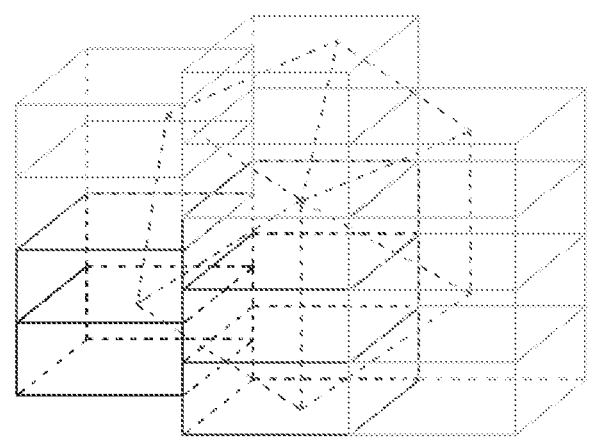

FIG. 2 shows a piece of surface 22 and a seed, represented by triangle 24 and cell 26. This is the result of the nextSeed method. The propagation may start from here. FIG. 3 shows the result of the first run of propagateFace, starting from the seed shown in FIG. 2. FIG. 3 shows seed cell 32, and bubble 34 obtained as a result. Triangle 24 is completely covered by the bubble. Other triangles 22 touch the bubble but are not completely covered by it. The intersectSurface method may then execute a propagateFace on each of triangles 22, using the bubble as a seed. FIG. 4 shows the result of the propagateFace method applied to a neighboring triangle 42, and the newly added cells 44. FIG. 5 shows how the process shown in FIG. 4 may be repeated (e.g. with the for loop in intersectSurface) until the whole surface is intersected in the grid.

Figure 6:
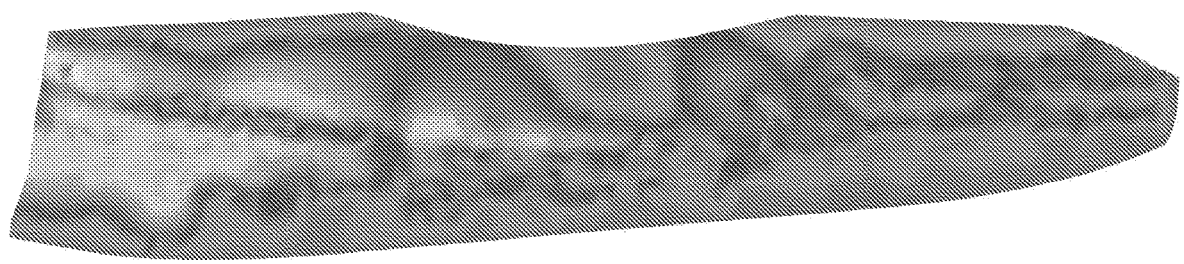
FIGS. 6-8 illustrate example results of the method.
Figure 7:
Figure 8:
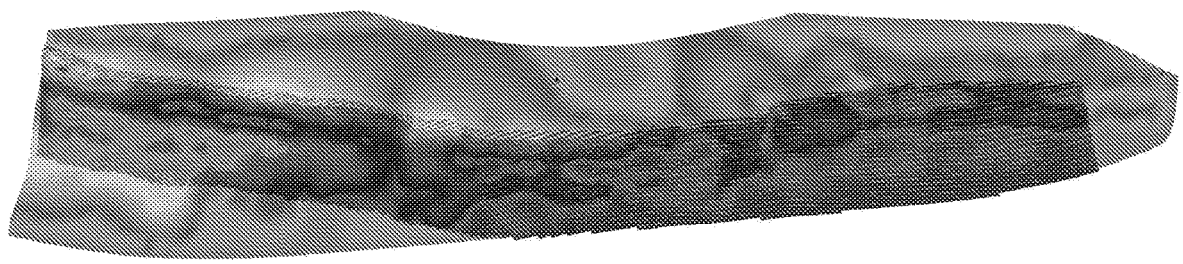

FIGS. 6-8 show an example of a structural fault surface with a downthrow highlighted in inter-cell connections. FIG. 6 shows the fault with the downthrow defined on its surface. FIG. 7 shows cell interfaces identified by the method, colored with the downthrow property transferred from the triangulated surface. FIG. 8 shows superposition of the two figures. FIG. 8 shows a very good match of the original property and the transferred property. Even more, the footprint of other intersecting faults visible in FIG. 6 is still clear on the transferred throw property coloring the interfaces representing the fault in the grid.

The proposed method may be applied in different situations. The following provides examples of such situations that concern reservoir simulation and the pre-processing leading to a clean simulation grid:

1. The standard exercise of historical data matching in the regular life of a field development: The proposed method allows determining the cell connections in the grid impacted by a given fault or faults in order to modify the transmissibility in the simulation phase to match the historical data. This process also allows a correct management of the fault intersections.
2. Set property dependent transmissibilities on the fault surfaces: In the case of large variations of flow affecting properties (Shale Gouge Ratio, Throw, Volume of Shale, etc.) on the fault plane one may want to set transmissibilities that follow these dependencies in a functional way. This is the case for example of listric faults with a strong dipping change with depth.
3. Introduce a fault without modifying the simulation grid: This is the case when a fault has been forgotten in the modeling-gridding phase, the fault has been underestimated at initial evaluations or there is need for a "feature" of unknown nature (Erosions, horizon unconformities, thin salt layers, etc.) that represents a flow impediment evidenced by the data collected from the field.
4. Modification of the geometry of a fault surface: Examples of this operation are creating extensions of a fault, cutting its boundaries, introducing a hole to simulate a fault relay or splitting the fault into several pieces that perform differently under flow simulation. Then, these modified faults replace their previous versions in the simulation without modifying the grid.
5. The method can be used to determine the area of influence of a fault to explicitly simulate its damage zone.

The method may apply in a context of any general unstructured simulation grid with several connected components and a family of triangulated surfaces with properties on the surfaces that affect the flow simulation. An issue in this context may be how to modify the simulation by changing the cell to cell connection parameters according to the family of surfaces with properties and their positions. The method may consist in a stair-step representation of a discrete surface and its properties in the simulation grid. The grid may be structured or unstructured, with or without non-neighbor connections. The surface may represent a zone of interest in the flow simulation.

Operational projects often face the following issues.

Fault transmissibility values are often calibrated in reservoir simulations in order to reproduce existing production data and to predict future reservoir behavior. Many existing methods are not adapted to stair-step or are too complicated to use because of the combinatorial augmentation of the parameters to tune. The provided method may allow to correctly describe stair-stepped faults (without holes or topological defaults) while allowing a simple tuning with a limited number of parameters.

The provided method may further allow adding new faults or modifying existing faults within a flow simulation without regenerating the grid, which can take much time and efforts and is thus not feasible in a "time-critical" context (such as when drilling a new production well).

The provided method may further allow modifying transmissibility values by following local variability of one or more properties defined on a fault surface. This allows, for example, generating transmissibility values depending on fault downthrow or on shale gouge ratio, which is an important feature notably in the case of significant variability of such properties.

The provided method allows solving such issues in a very general case. The local character of the method further allows handling grids and surfaces of a large size, and thus industrial application. This is thanks in examples to a complexity of O(n log n) for the "seeding" part and O(k) for the rest, where n is the number of cells in the grid and k is the number of cell couples that represent the surface in the grid.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of the methods is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

Figure 9:
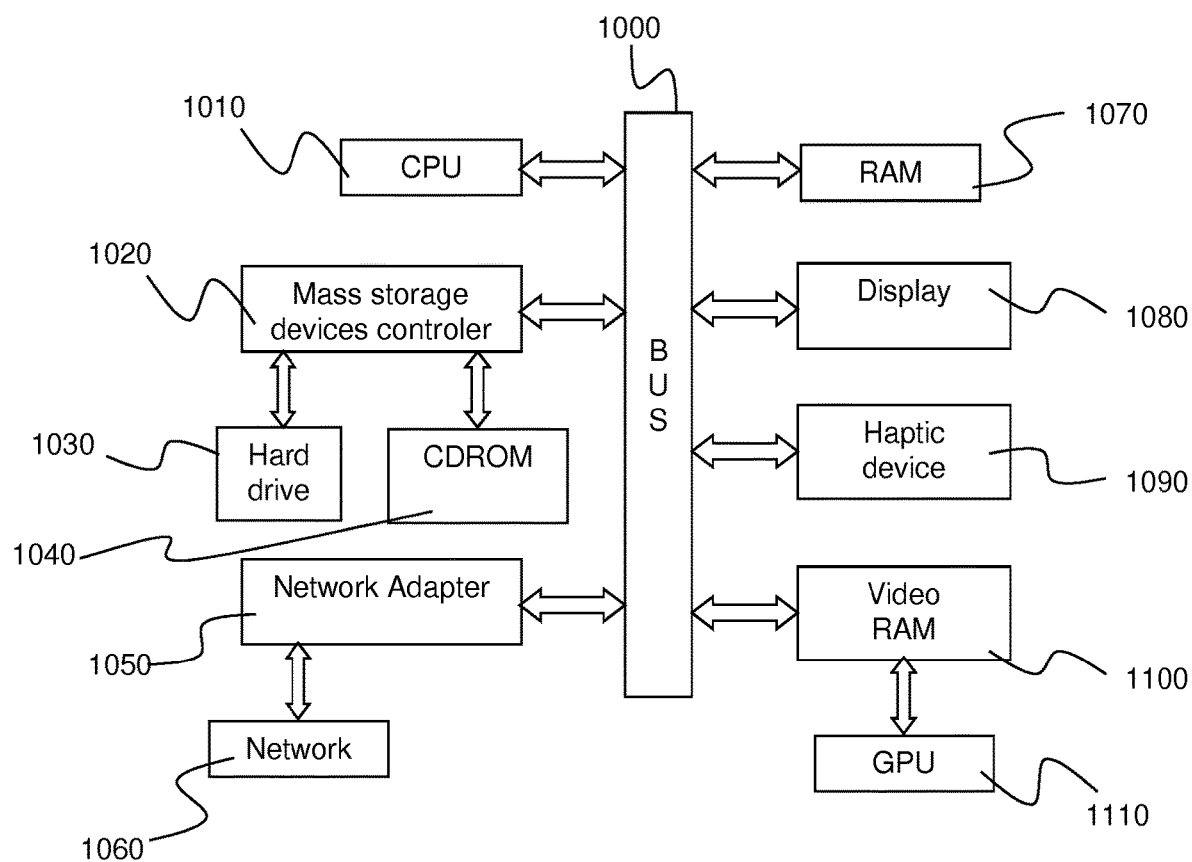
FIG. 9 shows an example of the system.

FIG. 9 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

The invention claimed is:

1. A computer-implemented method for configuring a geological simulation grid having an already-designed geometrical grid, without re-designing the geometrical grid, the method comprising:

providing a geometrical grid that conforms to a set of geological structures of a geological environment, the geometrical grid being provided with an initial set of parameters each assigned to a respective geometrical structure of the geometrical grid;

providing a geometrical surface that represents a geological surface of the geological environment, the geological surface being not included in the set of geological structures, the geometrical surface being provided based on data obtained after a determination of the geometrical grid, said data being information relative to the geological surface which was unknown at the time of the determination of the geometrical grid;

identifying geometrical structures of the geometrical grid, within the set of all connections between pairs of cells, that each correspond to a respective location of the geometrical surface and represent a local intersection with the geometrical surface; and transferring to each identified connection one or more respective parameters, each parameter being a value of a respective geological property of the geological surface, the method thereby configuring the geological simulation grid with respect to one or more geological properties of the geological surface, the identifying and the transferring being performed based on a result of a geological simulation performed with the geometrical grid and the initial set of parameters.

2. The method of claim 1, wherein the method includes comparing the result of the geological simulation performed with the geometrical grid and the initial set of parameters with corresponding real data.

3. The method of claim 1, wherein, for at least one identified connection that corresponds to a respective location of the geometrical surface, at least one parameter of the transferred one or more respective parameters depends on a size of said respective location.

4. The method of claim 1, wherein at least one property of the geological surface varies locally, each of the transferred one or more respective parameters that are a value of the at least one property being a local value.

5. The method of claim 1, wherein the identifying includes determining connections between pairs of cells each including a respective first cell that has a center located on one side of the geometrical surface and a respective second cell that is a neighbor of the respective first cell and has a center located on the other side of the geometrical surface.

6. The method of claim 4, wherein at least one of the cells of each of the identified connections intersects a respective discrete element of the geometrical surface.

7. The method of claim 5, wherein the determining of cells of the geometrical grid that each intersect a respective discrete element is iterated over the discrete elements via one or more neighborhood propagations over the discrete elements of the geometrical surface.

8. The method of claim 7, wherein at each non-starting iteration of each neighborhood propagation over the discrete elements of the geometrical surface, the determining of cells of the geometrical grid that each intersect a respective discrete element includes using cells determined at the previous iteration.

9. The method of claim 7, wherein at each non-starting iteration of each neighborhood propagation over the discrete elements of the geometrical surface, the determining of cells of the geometrical grid that each intersect a respective discrete element is performed via a neighborhood propagation on the cells of the grid.

10. The method of claim 5, wherein at each determining of a cell of the geometrical grid that intersects a respective discrete element, the method comprises finding the connections between the cell and its neighbors that cross the respective discrete element.

11. The method of claim 5, wherein at each determining of a connection between a pair of cells of the geometrical grid that intersects a respective discrete element, the method comprises transferring to the determined connection one or more respective parameters.

12. A computer program comprising instructions for performing the method of claim 1.

13. A system comprising a processor coupled to a memory, the memory having recorded thereon the computer program of claim 12.

* * * * *